United States Patent [19]

Shapiro

[11] Patent Number: 5,412,741
[45] Date of Patent: May 2, 1995

[54] APPARATUS AND METHOD FOR COMPRESSING INFORMATION

[75] Inventor: Jerome M. Shapiro, Philadelphia, Pa.

[73] Assignee: David Sarnoff Research Center, Inc., Princeton, N.J.

[21] Appl. No.: 7,694

[22] Filed: Jan. 22, 1993

[51] Int. Cl.6 .......................... G06K 9/36; H04N 7/12
[52] U.S. Cl. ..................... 382/232; 348/398; 358/426
[58] Field of Search ............... 382/56, 37; 348/398; 358/426, 261.3, 262.1, 432

[56] References Cited

U.S. PATENT DOCUMENTS

| 4,447,886 | 5/1984 | Meeker | 382/43 |
| 5,014,134 | 5/1991 | Lawton et al. | 358/432 |
| 5,048,111 | 9/1991 | Jones et al. | 358/426 |
| 5,049,990 | 9/1991 | Kondo et al. | 358/426 |
| 5,121,216 | 6/1992 | Chen et al. | 358/432 |
| 5,227,875 | 7/1993 | Suu et al. | 358/432 |
| 5,272,529 | 12/1993 | Fredericksen | 358/133 |

FOREIGN PATENT DOCUMENTS 0176243 8/1985 European Pat. Off. ....... H04B 1/66

OTHER PUBLICATIONS

"An Embedded Wavelet Hierarchical Image Coder" Jerome M. Shapiro, International Conference on Acoustic, Speech and Signal Processing, Mar. 1992.
"The Laplacian Pyramid As A Compact Image Code" P. J. Burt, E. H. Adelson IEEE Transaction On Communications, vol. Com 31, No. 4 Apr. 1983, pp. 532–540.
"A Practical Approach To Fractal-Based Image Compression" A. Pentland and B. Horowitz DDC '91, IEEE, pp. 176–185.
"An Introduction To Arithmetic Coding", IBM, J. Research & Development vol. 28 No. 2 Mar. 1984.
"Compression of Two-Dimensional Data" A. Lempel and J. Ziv 1986 IEEE Transaction On Information Theory, vol. IT-32, No. 1.
"Orthogonal Pyramid Transforms For Image Coding" E. H. Adelson and E. Simoncelli, R. Hingorani SPIE, Commun. and Image Proc. II 1987.
"Arithmetic Coding For Data Compression" I. H. Witten, R. M. Neal and J. G. Cleary Communications of the ACM Jun. 1987 vol. 30 No. 6 pp. 520–540.
E. P. Simoncelli et al in Chapter 4, "Subband Transforms" of Subband Image Coding, edited by John W. Woods, Kluwer Academic Publishers, Boston, 1991.

Primary Examiner—Michael T. Razavi
Assistant Examiner—David Fax
Attorney, Agent, or Firm—William J. Burke

[57] ABSTRACT

An apparatus and method for signal, image, or video compression that achieves high compression efficiency in a computationally efficient manner and corresponding decoder apparatus and methods are disclosed. This technique uses zerotree coding of wavelet coefficients in a much more efficient manner than previous techniques. The key is the dynamic generation of the list of coefficient indices to be scanned, whereby the dynamically generated list only contains coefficient indices for which a symbol must be encoded. This is a dramatic improvement over the prior art in which a static list of coefficient indices is used and each coefficient must be individually checked to see whether a) a symbol must be encoded, or b) it is completely predictable. Additionally, using dynamic list generation, the greater the compression of the signal, the less time it takes to perform the compression. Thus, using dynamic list generation, the computational burden is proportional to the size of the output compressed bit stream instead of being proportional to the size of the input signal or image.

21 Claims, 10 Drawing Sheets

APPARATUS AND METHOD FOR COMPRESSING INFORMATION

An application Ser. No. 08/007,465, entitled "Apparatus And Method For Emphasizing A Selected Region In The Compressed Representation Of An Image" for Jerome M. Shapiro, the inventor of this application and having the same assignee and bearing the designation DSRC 10966 has been filed concurrently herewith on Jan. 22, 1993.

The invention relates to an apparatus and method for efficiently compressing information for storage or transmission and an apparatus and method for decoding the compressed information.

BACKGROUND OF THE INVENTION

Data compression systems are useful to represent information as accurately as possible with a minimum number of bits and thus minimize the amount of data which must be stored or transmitted in an information storage or transmission system. One of the primary means of doing this is to remove redundant information From the original data. In the Proceedings of the International Conference on Acoustics, Speech and Signal Processing, San Francisco, Cal. March 1992, volume IV, pages 657–660, I disclosed a signal compression system which applies a hierarchical subband decomposition, or wavelet transform, followed by the hierarchical successive approximation entropy-coded quantizer incorporating zerotrees. The representation of signal data using a multiresolution hierarchical subband representation was disclosed by Burr et al in IEEE Trans. on Commun. Vol Com-31, No 4. April 1983, page 533. A wavelet pyramid, or a critically sampled quadrature-mirror filter (QMF) subband representation is a specific kind of multiresolution hierarchical subband representation. A wavelet pyramid was disclosed by Pentland et al in Proc. Data Compression Conference Apr. 8–11, 1991, Snowbird, Utah. A QMF subband pyramid has been described in "Subband Image Coding", J. W. Woods ed., Kluwer Academic Publishers, 1991 and I. Daubechies, *Ten Lectures on Wavelets*, Society for Industrial and Applied Mathematics (SIAM): Philadelphia, Pa., 1992.

Wavelet transforms otherwise known as hierarchical subband decomposition have recently been used for low bit rate image compression because it leads to a hierarchical multi-scale representation of the source image. Wavelet transforms are applied to an important aspect of low bit rate image coding: the coding of the binary map indicating the locations of the non-zero values, otherwise known as the significance map. Using scalar quantization followed by entropy coding, in order to achieve very low bit rates, i.e., less than 1 bit/pel, the probability of the most likely symbol after quantization—the zero symbol—must be extremely high. Typically, a large fraction of the bit budget must be spent on encoding the significance map. It follows that a significant improvement in encoding the significance map translates into a significant improvement in the compression of information preparatory to storage or transmission.

To accomplish this task, a new data structure called a zerotree is defined. A wavelet coefficient is said to be insignificant with respect to a given threshold T if the coefficient has a magnitude less than or equal to T. The zerotree is based on the hypothesis that if a wavelet coefficient at a coarse scale is insignificant with respect to a given threshold T, then all wavelet coefficients of the same orientation in the same spatial location at finer scales are likely to be insignificant with respect to T. Empirical evidence suggests that this hypothesis is often true.

More specifically, in a hierarchical subband system, with the exception of the highest frequency subbands, every coefficient at a given scale can be related to a set of coefficients at the next finer scale of similar orientation. The coefficient at the coarsest scale will be called the parent node, and all coefficients corresponding to the same spatial or temporal location at the next finer scale of similar orientation will be called child nodes. For a given parent node, the set of all coefficients at all finer scales of similar orientation corresponding to the same location are called descendants. Similarly, for a given child node, the set of coefficients at all coarser scales of similar orientation corresponding to the same location are called ancestors. With the exception of the lowest frequency subband, all parent nodes have four child nodes. For the lowest frequency subband, the parent-child relationship is defined such that each parent node has three child nodes.

A scanning of the coefficients is performed in such a way that no child node is scanned before any of its parent nodes. Given a threshold level to determine whether or not a coefficient is significant, a node is said to be a ZEROTREE ROOT if 1) the coefficient has an insignificant magnitude, 2) the node is not the descendant of a root, i.e. it is not completely predictable from a coarser scale, and 3) all of its descendants are insignificant. A ZEROTREE ROOT is encoded with a special symbol indicating that the insignificance of the coefficients at finer scales is completely predictable. To efficiently encode the binary significance map, three symbols are entropy coded: ZEROTREES, ISOLATED ZEROS, and non-zeros.

SUMMARY OF THE INVENTION

The invention is an apparatus and method for encoding information with a high degree of compression and corresponding decoder apparatus and methods. The invention uses zerotree coding of wavelet coefficients in a much more efficient manner than previous techniques. The key to this invention is the dynamic generation of the list of coefficient indices to be scanned, whereby the dynamically generated list only contains coefficient indices for which a symbol must be encoded. This is a dramatic improvement over the prior art in which a static list of coefficient indices is used and each coefficient must be individually checked to see whether a) a symbol must be encoded, or b) it is completely predictable.

Apparatus for encoding information comprises filter means for forming a wavelet transform of the image, means for forming a zerotree map from the output of the filter means, means for setting an initial threshold for encoding the wavelet coefficients, means for encoding the significant coefficients on an initial dominant list from the coarsest level of the transform and the children of those coefficients whose indices are appended to the dominant list as the coefficient of the parent is found to be significant, means for reducing the threshold, means for refining the estimate of the value of the significant coefficients to increase the accuracy of the coded coefficients, and means for cycling back to means for encoding the significant coefficients to scan the dominant list anew at the new, reduced threshold.

The invention is a method for encoding information comprising the steps of forming a wavelet transform of the image, forming a zerotree map of the wavelet coefficients, setting an initial threshold for encoding the wavelet coefficients, encoding the significant coefficients on an initial dominant list from the coarsest level of the transform and the children of those coefficients whose indices are appended to the dominant list as the coefficient of the parent is found to be significant, reducing the threshold, refining the estimate of the value of the significant coefficients to increase the accuracy of the coded coefficients, and cycling back to scan the dominant list anew at the new, reduced threshold.

The invention also includes an apparatus and method to decode signals that have been encoded using the apparatus of the invention.

DETAILED DESCRIPTION

For a wavelet hierarchical subband decomposition, the image is decomposed using times two subsampling into high horizontal-high vertical (HH), high horizontal-low vertical (HL), low horizontal-high vertical (LH), and low horizontal-low vertical (LL), frequency subbands. The LL subband is then further subsampled times two to produce a set of HH, HL, LH and LL subbands. This is down recursively to produce an array such as that illustrated in FIG. 1 where three subsamplings have been used. Preferably six subsamplings are used in practice. The parent-child dependencies are shown with the arrows pointing from the subband of the parent nodes to the subbands of the child nodes. The lowest frequency subband is the top left LL1, and the highest frequency subband is at the bottom right HH3. In this example, all child nodes have one parent.

Figure 2:
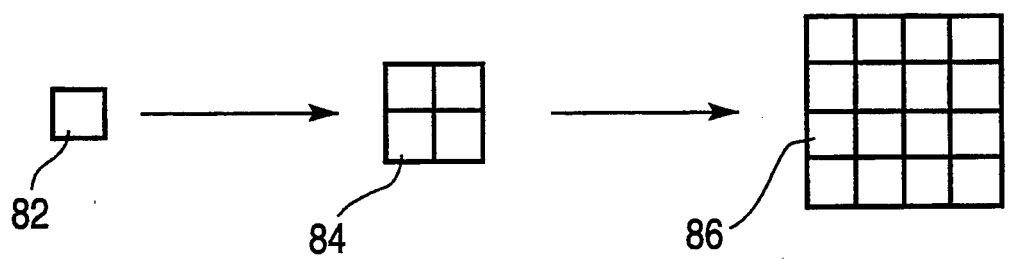
In FIG. 2, the parent-child relationship for three generations of a subsampled image is illustrated.

In FIG. 2, the parent-child relationship for three generations of a subsampled image is illustrated. A single parent node 82 has four child nodes 84 corresponding to the same region in the image with times four subsampling. Each child node 84 has four corresponding next generation child nodes 86 with a further times four subsampling.

In the previously disclosed method a Dominant List contains all coefficients for a given pass that have not yet been found to be significant. In the present invention, for a given pass, the Dominant List will contain the coordinates of those coefficients for which one of the following two conditions apply:

1. The coefficient has not yet been found to be significant AND, a symbol will be generated on the CURRENT dominant pass, or
2. The coefficient has been previously found to be significant BUT one of its descendants satisfied condition 1).

What is excluded from the Dominant List in the present invention is the coordinates of those coefficients which have not yet been found to be significant, but have ancestors that are zerotree roots. In this situation, no symbol would be generated. However, under the prior method, this position would have to be checked to verify this. The method of the invention avoids wasting computation in checking the predictability of coefficients that are part of zerotrees, and thus predictably insignificant, by dynamically generating the Dominant List during the dominant pass. At the beginning of a dominant pass, the Dominant List contains the coordinates of all of the coefficients in the coarsest scale (lowest frequency) subband whether or not they have been previously found to be significant. As this list is scanned during a dominant pass, if a coefficient in the coarsest scale subband has not previously been found to be significant, then one of 4 symbols is encoded: 1) ISOLATED ZERO, 2) ZEROTREE ROOT, 3) POSITIVE SIGNIFICANT, 4) NEGATIVE SIGNIFICANT. Specifically, a ZEROTREE ROOT symbol is used when all of the descendants of the coefficient under consideration are either predictably insignificant, or have previously been found to be significant. In other words, a ZEROTREE ROOT implies that for all of the descendants, no symbol will be generated on the current dominant pass. In the current invention whenever a coefficient on the dominant list is not coded as a ZEROTREE ROOT, the Dominant List for the current pass is appended to include the children of the current coefficient. Thus, the Dominant List for the current pass will contain the coordinates of all coefficients that are not descendants of zerotrees, and thus the computational cost and compression time will be significantly faster than that of the prior art.

Figure 1:
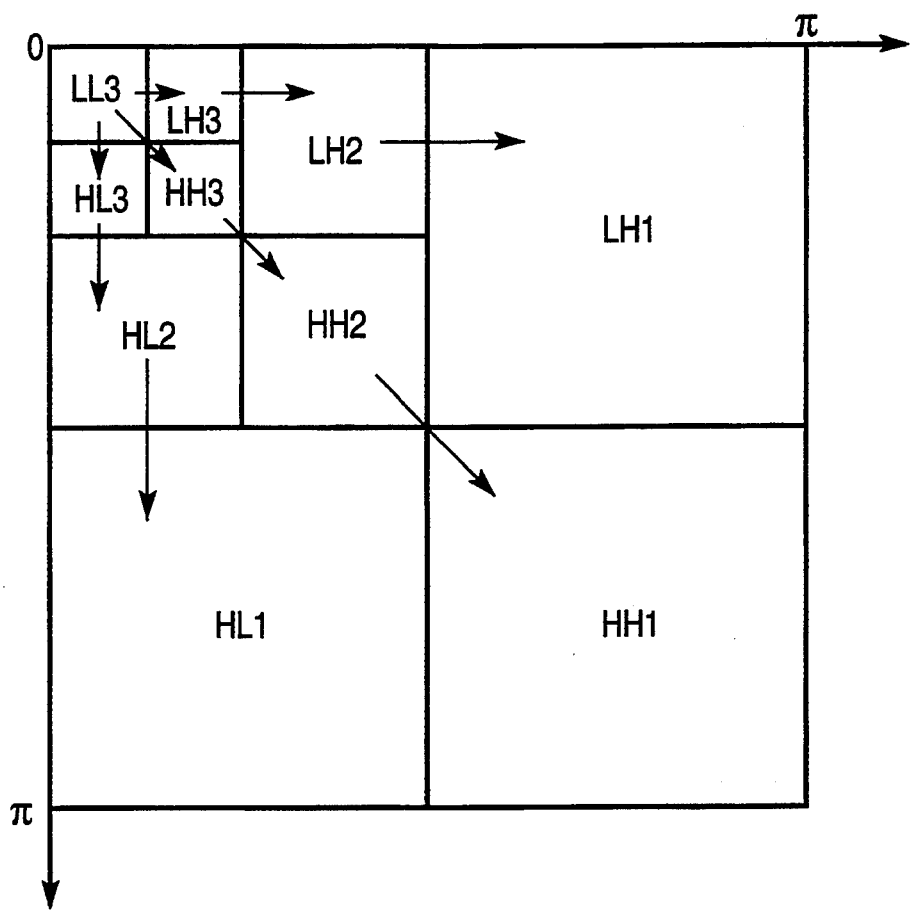
FIG. 1 is a schematic illustration of parent-child dependencies of subbands in an image decomposed to three scales.

Since the lowest frequency subband has children in three different subbands, during the scanning of the subband labeled LL3 in FIG. 1, three separate sublists of child coefficients to be scanned are maintained, one each for subbands labeled LH3, HL3, and HH3. After subband LL3 is finished, the three new sublists are combined and appended onto the dominant list. From this point on all coefficients have children in the same subband. Therefore, whenever a coefficient is not encoded as a ZEROTREE ROOT, the coordinates of its 4 children are appended to the end of the Dominant List.

In the disclosed means for determining the scanning order of the wavelet coefficients comprises the encoder and decoder each maintain two lists of coefficient coordinates in memory. At the beginning of a dominant pass, a dominant list contains the coordinates of those coefficients that have not yet been found to be significant. A subordinate list contains the coordinates of those coefficients that have been previously found to be significant with respect to previous, larger, thresholds. Each list contains the coordinates in the order in which the coefficients will be further processed for coding. At the beginning of the first stage, all coefficient coordinates are found in an original dominant list and the subordinate list is empty, since no coefficient has yet been established as being significant. As coefficients are determined to be significant or insignificant in the dominant pass, their entries are moved from the original dominant list to either the subordinate list, or to a newly generated dominant list, respectively. The original dominant list disappears after the coefficients associated with all of its entries have been evaluated, and the new dominant list and the subordinate list are subsequently refined at progressively finer thresholds.

In that process, a dominant list contains all coefficients for a given pass that have not yet been found to be significant. In the current invention, for a given pass, the dominant list will contain the coordinates of those coefficients which meet at least one of the following three conditions: 1) The coefficient has not yet been found to be significant AND, a symbol will be generated on the CURRENT dominant pass, or 2) The coefficient has been previously found to be significant BUT one of its descendants satisfied condition 1) or 3) The coefficient is in the coarsest scale (lowest frequency) subband.

What is excluded in the preferred method as opposed to the previous method is the coordinates of those coefficients which have not yet been found to be significant, but have ancestors that are ZEROTREE ROOTS. In this situation, no symbol would be generated. However, under the previously disclosed method, this position would have to be checked to verify this.

This preferred method avoids wasting computation in checking the predictability of coefficients that are part of zerotrees, and thus predictably insignificant, by dynamically generating the dominant list during the dominant pass. At the beginning of a dominant pass, the dominant list contains the coordinates of all of the coefficients in the coarsest scale (lowest frequency) subband whether or not they have been previously found to be significant. As this list is scanned during a dominant pass, if a coefficient in the coarsest scale subband has not previously been found to be significant, then one of 4 symbols is encoded: 1) ISOLATED ZERO, 2) ZEROTREE ROOT, 3) POSITIVE SIGNIFICANT, or 4) NEGATIVE SIGNIFICANT. Specifically, a ZEROTREE ROOT symbol is used when all of the descendants of the coefficient under consideration are either predictably insignificant, or have previously been found to be significant. In other words, a ZEROTREE ROOT implies that for all of the descendants, no symbol will be generated on the current dominant pass. In the preferred method whenever a current coefficient on the dominant list is not coded as a ZEROTREE ROOT, the children of the current coefficient are appended to the dominant list for the current pass. Thus, the dominant list for the current pass will contain the coordinates of all coefficients that are not descendants of zerotree roots, and thus the computational cost and compression time will be significantly faster than that of the prior art.

In the preferred mode of operation for image coding, since the lowest frequency subband has children in three different subbands shown in FIG. 1, during the scanning of the subband labeled LL3, three separate sublists of child coefficients to be scanned are maintained, one each for subbands labeled LH3, HL3, and HH3. After subband LL3 is finished, the three new sublists are combined and appended onto the dominant list. From this point on all coefficients have children in the same subband. Therefore, whenever a coefficient is not encoded as a ZEROTREE ROOT, the coordinates of its 4 children are appended to the end of the dominant list.

Figure 3:
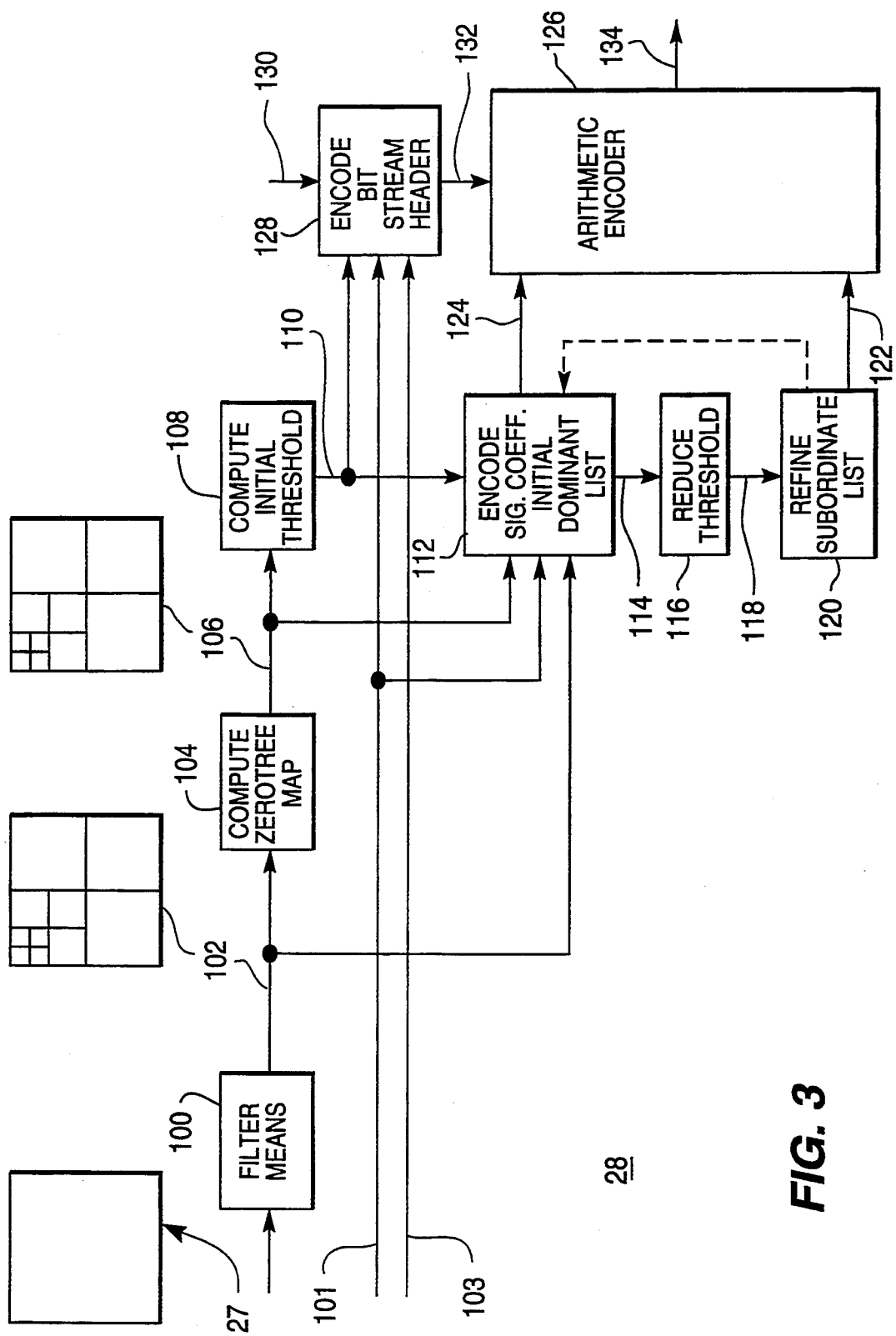
FIG. 3 is a block diagram of the image encoder of FIG. 1

FIG. 3 is a block diagram of the image encoder 28 shown in FIG. 1 of the aforesaid concurrently-filed application Ser. No. 08/007,465 for an image input 27. Image encoder 28 includes filter means 100 for the subband decomposition to produce the wavelet transform of the image 27. The wavelet transform output 102 of the filter means 100 provides the input to means 104 for computing the zerotree map 106. The zerotree map is used to determine if an insignificant coefficient is a ZEROTREE ROOT or has at least one significant descendant. The zerotree map Z for each coefficient is formed as follows: 1) The magnitude of each coefficient in the subband decomposition is copied into the array for the zerotree map. 2) All bits in the copy except the most significant "1" bit for each coefficient are set to zero. This value is referred to as the initial zerotree map value. The actual zerotree map value for a coefficient is defined as the bitwise OR operation between the initial zerotree map value of itself and the initial zerotree map value of all of its descendants. This can be computed recursively, always computing the actual zerotree map value for children before their parents, by computing the bitwise OR operation between its initial zerotree map value and the actual zerotree map values of its children, which would have already been computed. Using the bitwise OR operation, a bit position in Z is "1" when either itself or any of its descendants has their most significant "1" bit at that position.

The zerotree map 106 provides the input to means 108 for computing the initial threshold to be used in the analysis of the wavelet coefficients. The threshold is preferably set to values which are powers of two. The initial threshold is then preferably chosen to be a value equal to the largest power of two less than the largest zerotree map value in the coarsest LL subband.

Figure 5:
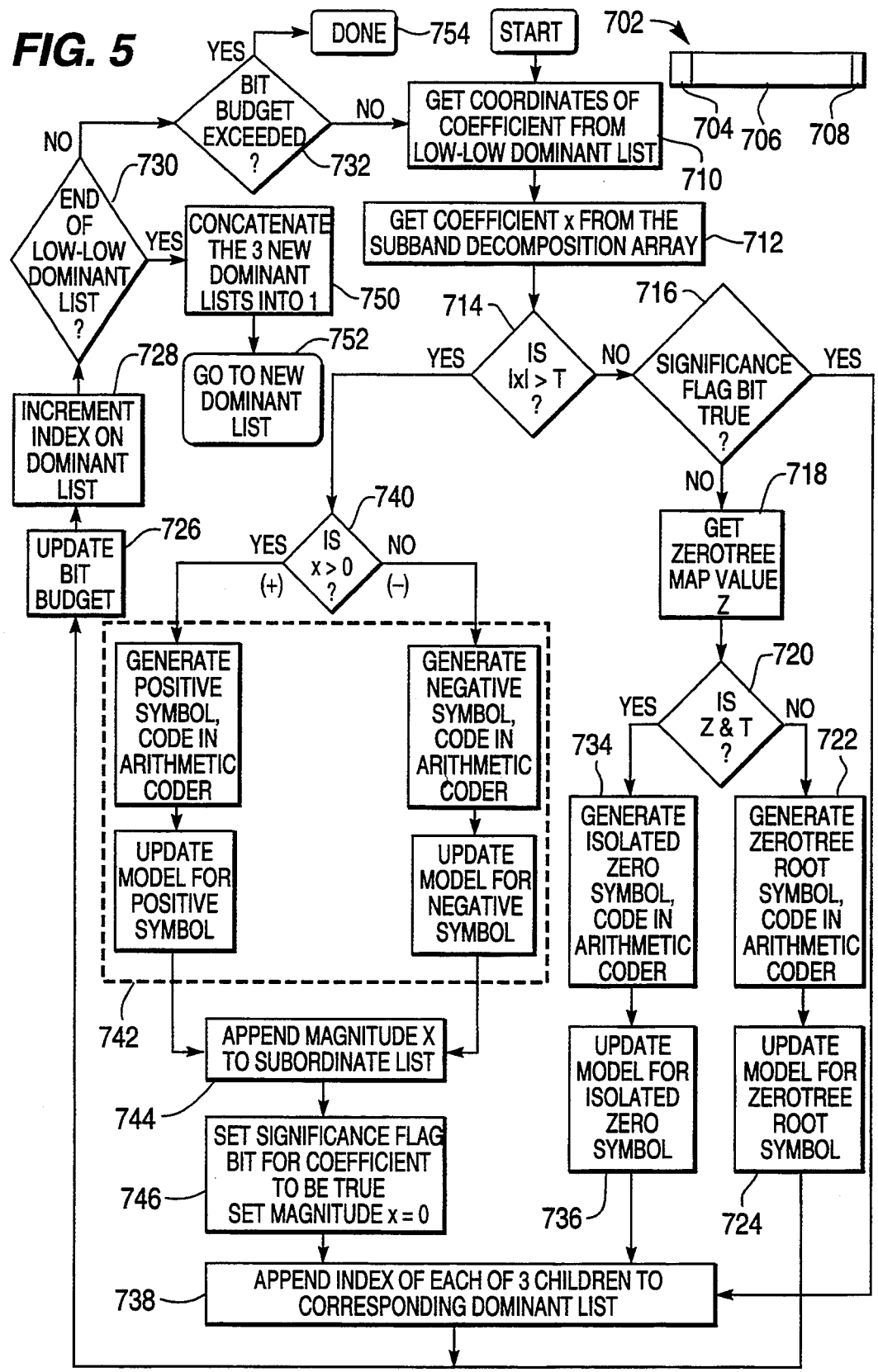
FIG. 5, 6, and 7 are flowcharts illustrating the coding method of the invention.
Figure 6:
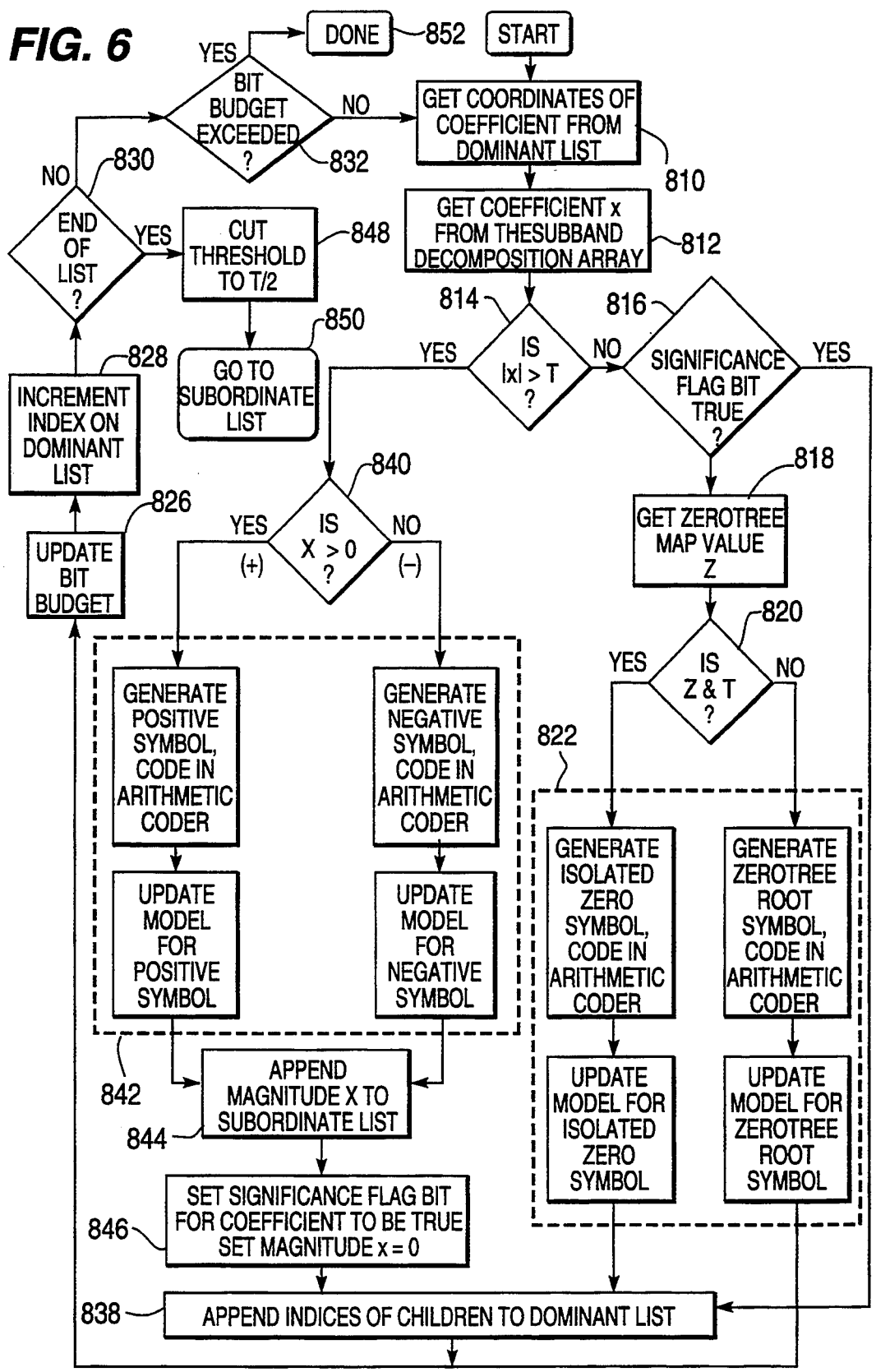

The output 110 of the means 108 provides the input to means 112 for encoding the significant coefficients on the initial dominant list from the LL subband at the coarsest level (shown in detail in FIG. 5) and their children whose indices are appended to the dominant list as the coefficient of the parent is found not to be a zerotree root (shown in detail in FIG. 6). The subband decomposition 102, the zerotree map 106, the number of wavelet scales 101 and the bit budget are additional inputs to the means 112.

Once the complete dominant list, including children has been scanned at threshold T(0), the output 114 of means 112 provides the input to means 116 for reducing the threshold, preferably in half. The output 118 of means 116 provides the input to means 120 for refining the subordinate list to increase the accuracy of the coded coefficients (shown in detail in FIG. 7). The encoding system then cycles back to means 112 (shown as a dashed line) to scan the dominant list anew at the new, reduced threshold. The output 122 of means 120 and an output 124 of means 112 provide inputs to an arithmetic coder 126. The operation of an arithmetic entropy coder for data compression is discussed in Witten et al., "Arithmetic Coding for Data Compression", Communications of the ACM, Volume 30, No. 6, June 1987, and in Langdon, Jr. et al., "An Introduction to Arithmetic Coding", IBM, J. Res. Develop., Vol. 28, No. 2, March 1984.

Means 128 for encoding the bit stream header accepts as inputs the number of wavelet scales 101, the image mean 103, the initial threshold 110 and image dimensions 130. The output of means 128 provides an input to the coder 126. The output of coder 126 is the encoded, compressed bit stream representative of the input image.

Figure 4:
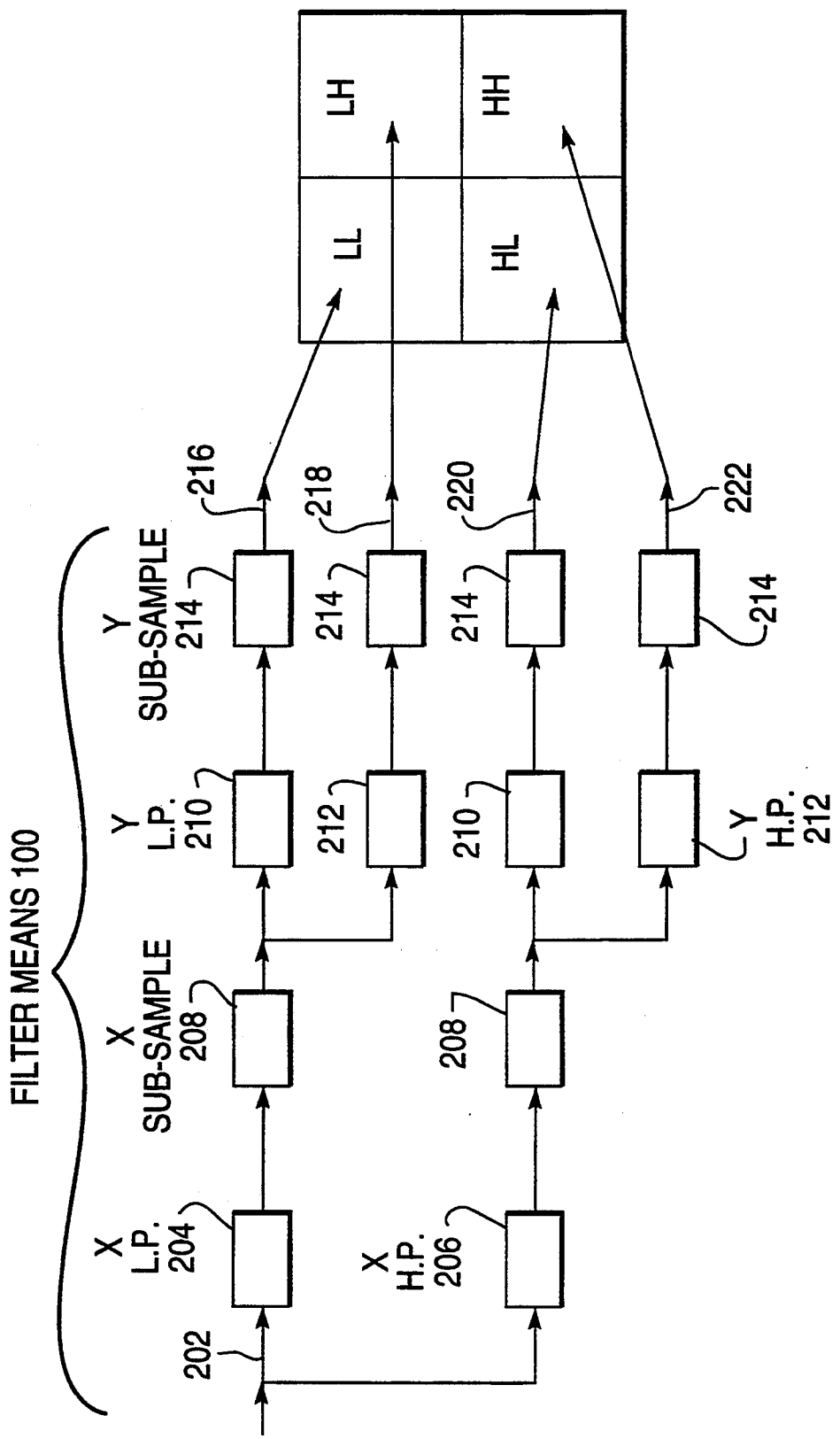
FIG. 4 is a block diagram of the filter apparatus used to perform a one-scale subband decomposition of an image.

In FIG. 4 filter means 100 for a one-scale subband decomposition of an image is shown. Input signal 202 is horizontally low pass and high pass filtered by filters 204 and 206 respectively before being horizontally subsampled by times two horizontal subsampling filters 208. The horizontally low pass output signal from filters 204 and 208 is vertically low pass and high pass filtered by filters 210 and 212 before being vertically subsampled by times two vertical subsampling filters 214, respectively. Subband components LL and LH appear at outputs 216 and 218, respectively. Similarly, the horizontally high pass output signal from filters 206 and 208 is vertically low pass and high pass filtered by filters 210 and 212 before being vertically subsampled by times two vertical subsampling filters 214, respectively. Subband components HL and HH appear at outputs 220 and 222, respectively. The filters associated with the apparatus 200 are preferably digital quadrature mirror filters (QMF) for splitting the horizontal and vertical frequency bands into low frequency and high frequency bands. Additional scales are produced by repeatedly performing a one-scale subband decomposition on the LL subband. QMF filters at each decomposition level are similar to one another. A reference for this is "Subband Image Coding", edited by John W. Woods, Kluwer Academic Publishers, Boston, 1991 and I. Daubechies, *Ten Lectures on Wavelets*, Society for Industrial and Applied Mathematics (SIAM): Philadelphia, Pa., 1992. More specifically, specifications of the low and high pass filters can be found in the Chapter 4, "Subband Transforms" of that book by E. P. Simoncelli et al. The Appendix of that Chapter provides details of the filter design. The decomposition itself is also disclosed in "A Practical Approach to Fractal-Based Image Compression" by A. Pentland and B. Horowitz, Proceeding of the Data Compression Conference 1991, Snowbird UT, page 179, FIG. 2.

The bit budget may be a function of a variety of factors, such as the product of the desired bit rate (e.g., 0.25 bits/pel) and the number of coefficients to be coded (in this case 262,144 subband coefficients for a 512×512 image), the capacity of a modem by which the coded bit stream will be transmitted, or the capacity of a disk or tape used to store the coded bit stream.

The threshold is typically progressively reduced by a factor of 2, although other factors may be selected depending on the requirements of a particular system. The threshold has to be a power of two for the bitwise operations to work and is preferred. In the dominant pass three coefficient possibilities (positive significant, negative significant and insignificant) are coded using an alphabet of four symbols. The four symbols are "0" representing an insignificant isolated zero coefficient, "1" representing an insignificant ZEROTREE ROOT, "2" representing a positive significant coefficient, and "3" representing a negative significant coefficient. The ZEROTREE ROOT symbol is the only "grouped" symbol and can occur only in the case of a coefficient with descendants. Although five coding possibilities exist, only the four listed coding symbols are used. The uncoded fifth possibility, an insignificant coefficient descending from a ZEROTREE ROOT, is implicitly coded when a "1" ZEROTREE ROOT symbol is encoded for the ancestor.

The method for for determining the significance of the coefficients from the LL subband at the coarsest frequency on the initial dominant list and of the descendants in all other subbands after they are appended to the dominant list are described with reference to FIGS. 5 and 6, respectively. These operations are repeated in a loop for later, smaller thresholds. Coding starts by obtaining the coordinates of the first coefficients from the low-low dominant list. The list is defined such that each entry is an ordered pair (x,y) coordinate of an associated element of the subband decomposition for which a coefficient has been generated and placed in memory at the prescribed address. The processing order for the low-low subband is generated in accordance with a so-called Peano-Hilbert plane filling curve as discussed in Lempel et al., "Compression of Two-Dimensional Data", IEEE Transactions on Information Theory, No 1. January 1986. In FIG. 14 a diagram of an sequence for scanning positions in a subband is shown.

In FIG. 5 the data structure 702 of a wavelet coefficient x includes a sign bit 704, magnitude bits 706 and Significance Flag bit 708. At system startup, prior to any encoding, the Significance Flag bit 708 for all coefficients is initially set to FALSE (0). When a coefficient is found to be significant using the means described in FIGS. 5 and 6, its Significance Flag bit will be set to TRUE (1) and will remain TRUE (1) for all future passes at all smaller thresholds.

In FIG. 5 at the start of the coding process the dominant list includes only the coordinates of the coefficients from the lowest frequency (coarsest) subband, eg LL3 in FIG. 1. The method starts with the step 710 of fetching the coordinates of the first coefficient on the LL dominant list and the step 712 of fetching the value x of the first coefficient on the LL dominant list. Step 714 is comparing the magnitude of x with the initial threshold T. If the answer is NO, then the Significance Flag bit for the coefficient is checked in step 716. If the Significance Flag bit is FALSE, the zerotree map value Z is fetched in step 718 and compared in step 720 with the threshold value T in a bitwise AND (&) operation to determine whether the coefficient is a ZEROTREE ROOT or an ISOLATED ZERO. If it is a ZEROTREE ROOT, then a ZEROTREE ROOT symbol is generated in step 722 and coded in the arithmetic coder. The arithmetic coder model is then updated in step 724 and the system recycled through steps 726, 728, 730 and 732 to update the bit budget, increment the index on the dominant list, compare indices to determine whether the initial LL dominant list has been fully scanned and determine whether the bit budget has been exceeded. If it is a ISOLATED ZERO, then an ISOLATED ZERO symbol is generated in step 734 and coded in the arithmetic coder. The arithmetic coder model is then updated in step 736, the indices of the three children of the coefficient are appended to the corresponding dominant list in step 738 and the system recycles as before. If in step 716 the Significance Flag bit is TRUE, then no symbol is generated for the arithmetic coder, but the indices of the three children of the coefficient are still appended to the corresponding dominant list in step 738 and the system recycles are before.

If the answer is YES at step 714, the sign of the coefficient is determined in step 740 to be POSITIVE or NEGATIVE. In step 742 (shown in dashed box), depending upon whether the coefficient is POSITIVE or NEGATIVE, a POSITIVE or NEGATIVE symbol is generated, coded into the arithmetic coder, and the arithmetic coder model is updated for a POSITIVE or NEGATIVE symbol respectively. The magnitude of the coefficient x is then is then appended to the Subordinate List in step 744. In step 746 the Significance Flag is then set to be TRUE and the magnitude of the coefficient x is set equal to zero. The three children of the coefficient are then appended to the corresponding Dominant List in step 738.

This procedure is repeated for each coefficient on the LL Dominant List until all coefficients are coded and the end of the LL Dominant List is detected in step 730. At that point the three lists of children of the LL Dominant List coefficient are then concatenated to form a single list appended to the Dominant List and the coding process continued as indicated by step 752 and as illustrated in FIG. 6.

In FIG. 6 at the start of the coding process the dominant list includes the coordinates of the coefficients which are children of coefficients of the lowest frequency (coarsest) subband which were not found to be zerotree roots for the current threshold T. The method starts with the step 810 of fetching the coordinates of the first coefficient on the child dominant list and the step 812 of fetching the value x of the first coefficient on the child dominant list. Step 814 is comparing the magnitude x with the initial threshold T. If the answer is NO, i.e. the magnitude of x is less than T, then the Significance Flag bit for the coefficient is checked in step 816. If the flag bit is found to be TRUE, the coefficient is known to have been found to be significant during a prior dominant pass and its children are appended to the Dominant List. If the flag bit is found to be FALSE then the zerotree map value Z is fetched in step 818 and compared in step 820 with the threshold value T in a bitwise AND (&) operation to determine whether the coefficient is a ZEROTREE ROOT or an ISOLATED ZERO. In step 822 (shown in dashed box), depending upon whether the coefficient is a ZEROTREE ROOT or an ISOLATED ZERO, a ZEROTREE ROOT or an ISOLATED ZERO symbol is generated, coded into the arithmetic coder, and the arithmetic coder model is updated for a ZEROTREE ROOT or an ISOLATED ZERO symbol respectively. If the coefficient is found to be a ZEROTREE ROOT, then the system recycled through steps 826, 828, 830 and 832 to update the bit budget, increment the index on the dominant list, compare indices to determine whether the Dominant List has been fully scanned and determine whether the bit budget has been exceeded. If it is a ISOLATED ZERO, then the indices of the children of the coefficient are appended to the corresponding dominant list in step 838 and the system recycled as before.

If the answer is YES at step 814, the sign of the coefficient is determined in step 840 to be POSITIVE or NEGATIVE. In step 842 (shown in dashed box), depending upon whether the coefficient is POSITIVE or NEGATIVE, a POSITIVE or NEGATIVE symbol is generated, coded into the arithmetic coder, and the arithmetic coder model is updated for a POSITIVE or NEGATIVE symbol respectively. The magnitude x of the coefficient is then appended to the Subordinate List in step 844. In step 846 the Significance Flag is then set to be TRUE and the magnitude of the coefficient is set equal to zero. The children of the coefficient are then appended to the corresponding Dominant List in step 838.

Figure 7:
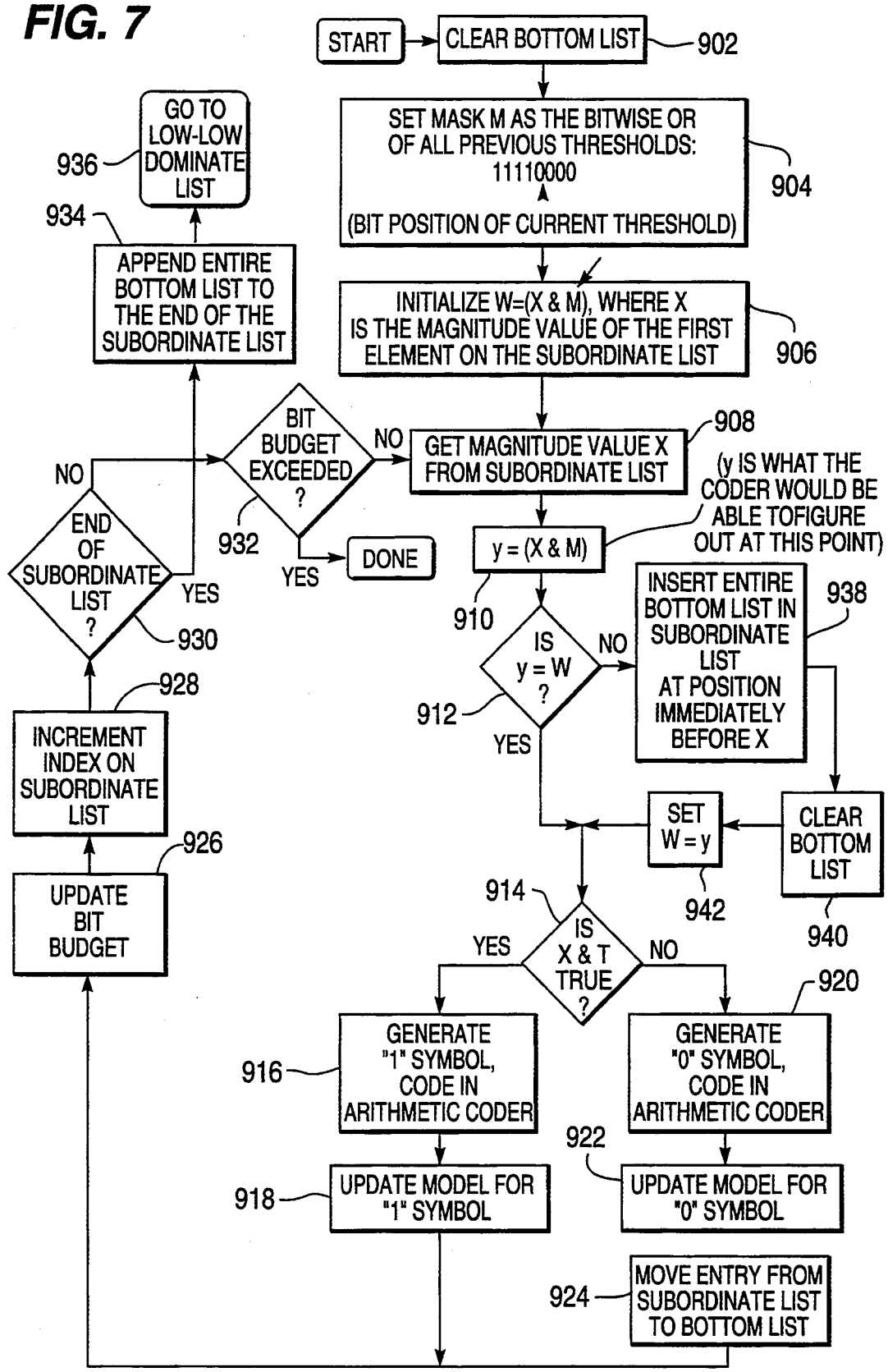

This procedure is repeated for each coefficient on the Dominant List and all that are appended during the cycling of this process until all coefficient are coded and the end of the Dominant List is detected in step 830. At that point all the coefficients have been coded for that threshold level T the process continues as indicated by step 848 in which the threshold is cut in half and the Subordinate List scanned in step 850, and as illustrated in FIG. 7, to increase the precision of the coefficients have thus far been found to be significant. Once the Subordinate List is completed, the system returns to the LL Dominant List and repeats the process illustrated in FIGS. 5 and 6 at the new threshold T/2 until the bit budget is exceeded in step 832 and the system stops scanning as indicated by step 852.

Once the scan of the entire Dominant List including all appended coefficient has been completed, the Subordinate List coefficients are further refined by the coding process illustrated in FIG. 7.

In FIG. 7, the refinement of the value of the coefficients placed on the Subordinate List during the scan of the Dominant List at the threshold level T is carried out at a threshold level of T/2. In the preferred mode of operation the threshold level is always a power of 2 and can be described in a binary code by a string of ones and zeroes. The first step 902 is clearing the Bottom List, to be defined later. A mask M is then defined as the bitwise OR of all the previous thresholds. The mask M then has ones in each bit position up to but excluding the bit position representative of the current threshold level. Step 906 initializes a reference bit string W equal to the bitwise AND of the magnitude x of the first coefficient on the Subordinate List and the mask M. Step 908 is the first step in the loop to scan all the coefficients on the Subordinate List for all previous thresholds. Step 910 sets a second reference bit string Y equal to the bitwise AND of the magnitude x of the first coefficient on the Subordinate List and the mask M. This step is repetitive of step 906 for the first coefficient but takes on different values as other coefficients are scanned. Step 912 compares the values of the first and second reference bit strings W and Y. The answer is YES for all coefficient on the Subordinate List on the first pass since all are greater that the first threshold level.

Step 914 is a bitwise AND comparison of the magnitude x of the coefficient with the present threshold. For example, if in the binary representation x=1????? and the threshold T=010000 the YES/NO decision depends upon whether the second bit in x is a one or zero. If a one, then the magnitude of x is greater than a level of 11???? or in the upper half of the range between threshold T and the previous threshold 2T. If a zero, then the magnitude of x is less than a level of 11???? or in the lower half of the range between threshold T and the previous threshold 2T. Thus an additional bit of accuracy has been gained in assessing the value of the particular coefficient. If a YES, the symbol "1" is coded into the arithmetic coder and the model is updated in steps 916 and 918, respectively. If a NO, the symbol "0" is coded into the arithmetic coder and the model is updated in steps 920 and 922, respectively. The coefficient is then removed from the Subordinate List and added to a separate list, the Bottom List, which holds all coefficients in the lower half of the range. This is the sequence on the first scan of the Subordinate List since all coefficients are greater than T.

The system then cycles through steps 926, 928, 930 and 932 which update the bit budget, increment the index on the Subordinate List, determine whether the end of the Subordinate List has been reached or not and tests to determine whether the bit budget for the storage or transmission channel has been exceeded. The system is then ready to test the next coefficient.

Once all coefficients on the Subordinate List for that subordinate pass have been evaluated, the end of the Subordinate List has been reached and the system exits the scanning loop. Step 934 appends all coefficients on the Bottom List to the end of the Subordinate List. This step restores the coefficients on the Bottom List to the Subordinate List and places them at the end of the list, thereby completing a sorting the coefficients by their value. Step 936 the returns the system to encoder 112 of FIG. 3 and corresponding step 710 of FIG. 5 to start a new scan of the LL Dominant List at threshold T.

Once the next scan of the Dominant List, including children, is completed, the Subordinate List has been supplemented by all those coefficients having values between T and 2T. The scan proceeds as before except when the bitwise AND of the present coefficient and the mask M equal to Y does not equal the bitwise AND of the mask M with the first coefficient on the Subordinate List equal to W, certain to be a large value. Then, in step 938 the entire Bottom List accumulated to that point in the scan of the Subordinate List is inserted in the Subordinate List immediately in front of the present coefficient. Step 940 clears the Bottom List and step 942 sets Y=W. The scan process then returns to the loop at step 914. Thus the subordinate list is continually sorted to arrange the coefficients in order of decreasing magnitude with each successive scan at a threshold reduced by a factor of two from the previous threshold.

Figure 9:
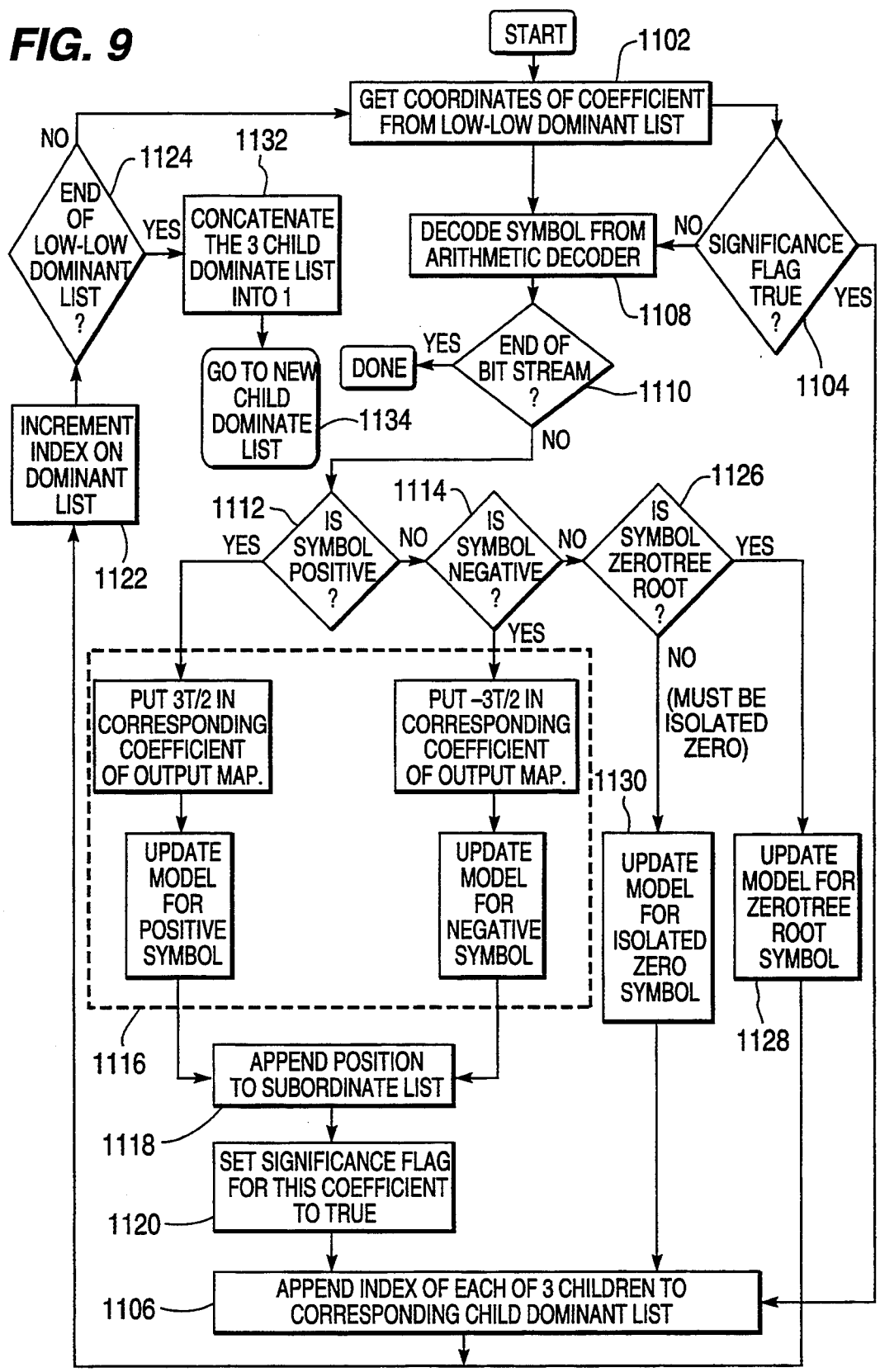
FIGS. 9, 10 and 11 are flowcharts illustrating the decoding method of the invention.
Figure 10:
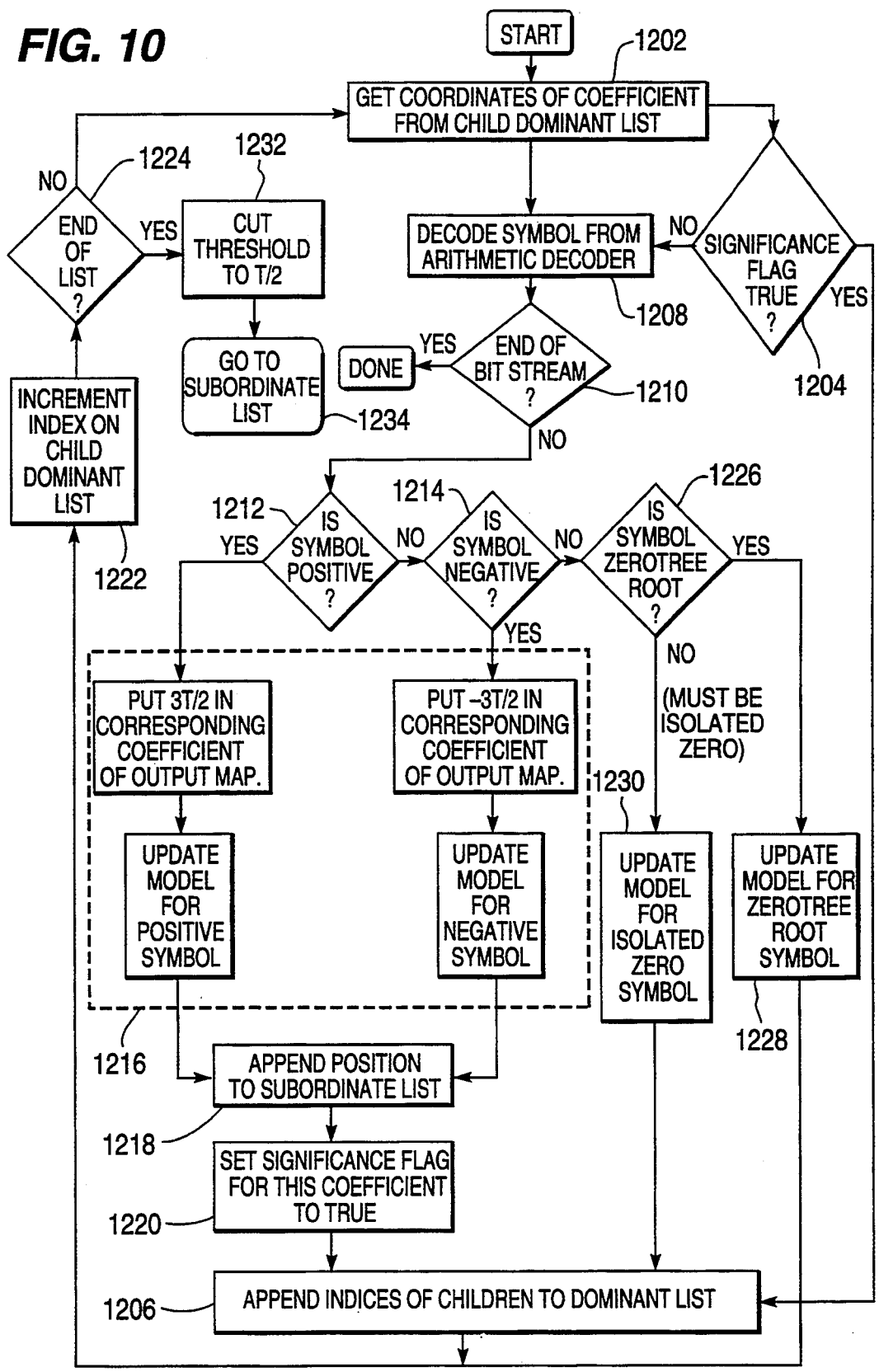

The decoder 1000, which operates in the converse of the encoder 28 of FIG. 3, includes means 1002 for decoding the incoming bit stream 1004 to separate the header bits from the data bits. The data bits are provided as an input 1006 to the Dominant List decoder 1008. Additional inputs to decoder 1008 are the image dimensions 1024, the starting threshold 1025 and the number of wavelet scales 1026 which are also outputs of the means 1002. The operation of decoder 1008 is illustrated in FIGS. 9 and 10. Dashed line 1010 indicates the loop performed within decoder 1008 as the Dominant List with the appended children are scanned. Once the entire Dominant List, including appended children, is scanned for the first threshold, the threshold is cut in half in means 1012 and the Subordinate List is processed in means 1014. Dashed line 1016 indicates the loop performed once the Subordinate List has been refined at the new threshold value back to the decoder 1008 to scan the Dominant List at the new threshold.

The outputs of the decoder 1008 and the means 1014, 1018 and 1020 respectively, provide the values of the wavelet coefficients to means 1022 for constructing the wavelet transform array. Additional inputs to means 1022 are the image size 1024, the number of wavelet scales 1026 and the output 1028 of means 1030 for initializing the by setting all Significance Flags to be FALSE and the magnitudes of all coefficients to be zero. The output 1032 of means 1022 is the array of wavelet coefficients representative of the transmitted image. The output 1032 provides an input to means 1034 for computing the inverse wavelet transform of the array of wavelet coefficients. Additional inputs to means 1034 are the image size 1024 and the number of wavelet scales 1026. The method for performing the inverse wavelet transform has been described in "Subband Image Coding", J. W. Woods ed., Kluwer Academic Publishers, 1991 and I. Daubechies, *Ten Lectures on Wavelets*, Society for Industrial and Applied Mathematics (SIAM): Philadelphia, Pa., 1992.

The output 1036 of the means 1034 provides an input to means 1038 for adding the image mean to the inverse wavelet transform. The image mean output 1040 from decoder means 1002 provides a second input to means 1038. The output 1042 means 1038 is the transmitted image reconstructed to the extent possible given the number of bits transmitted.

Figure 11:
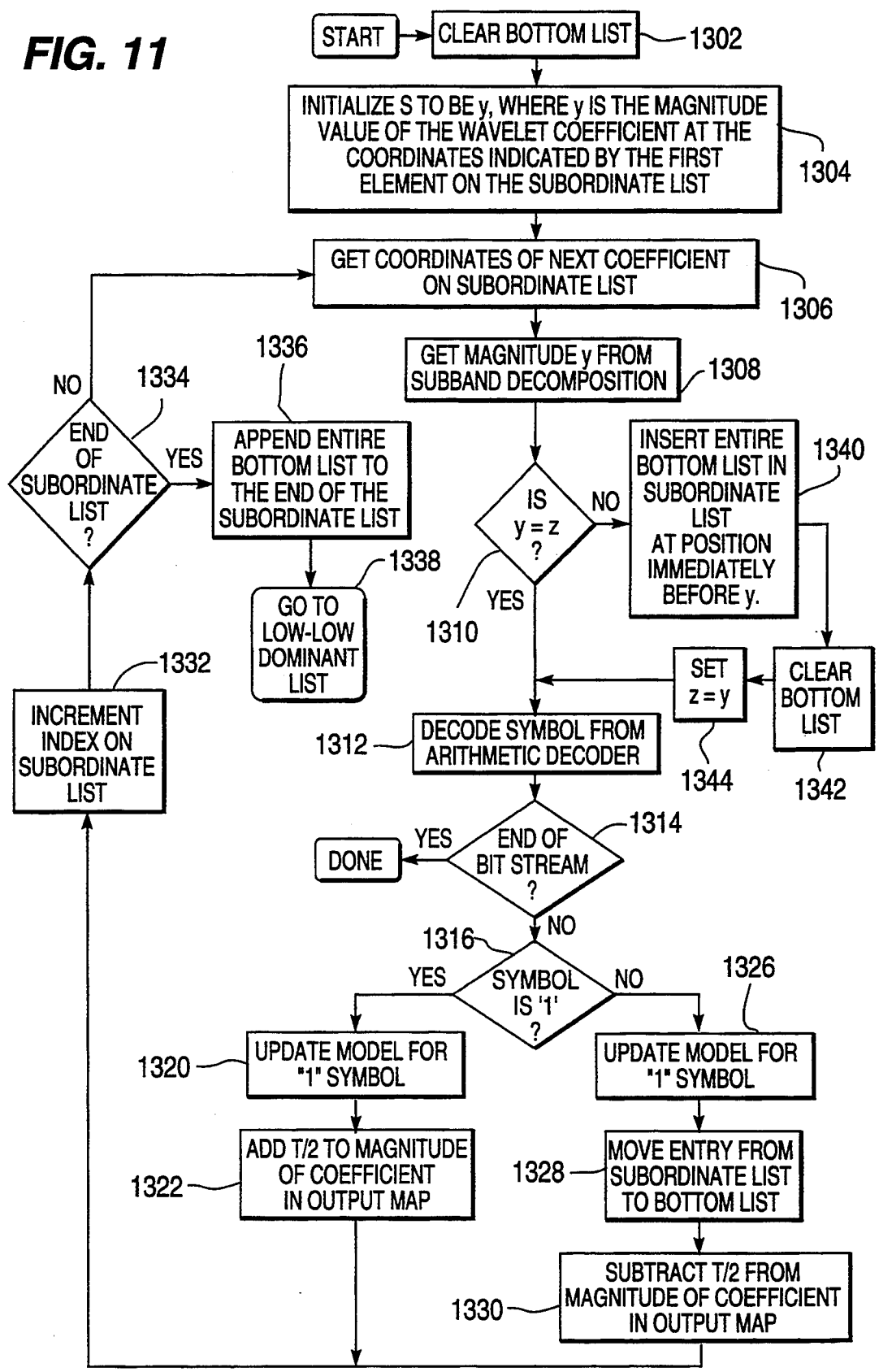

FIGS. 9-11 are flowcharts illustrating the decoding procedure for a signal compressed using the procedure described in FIGS. 5-7.

Figure 8:
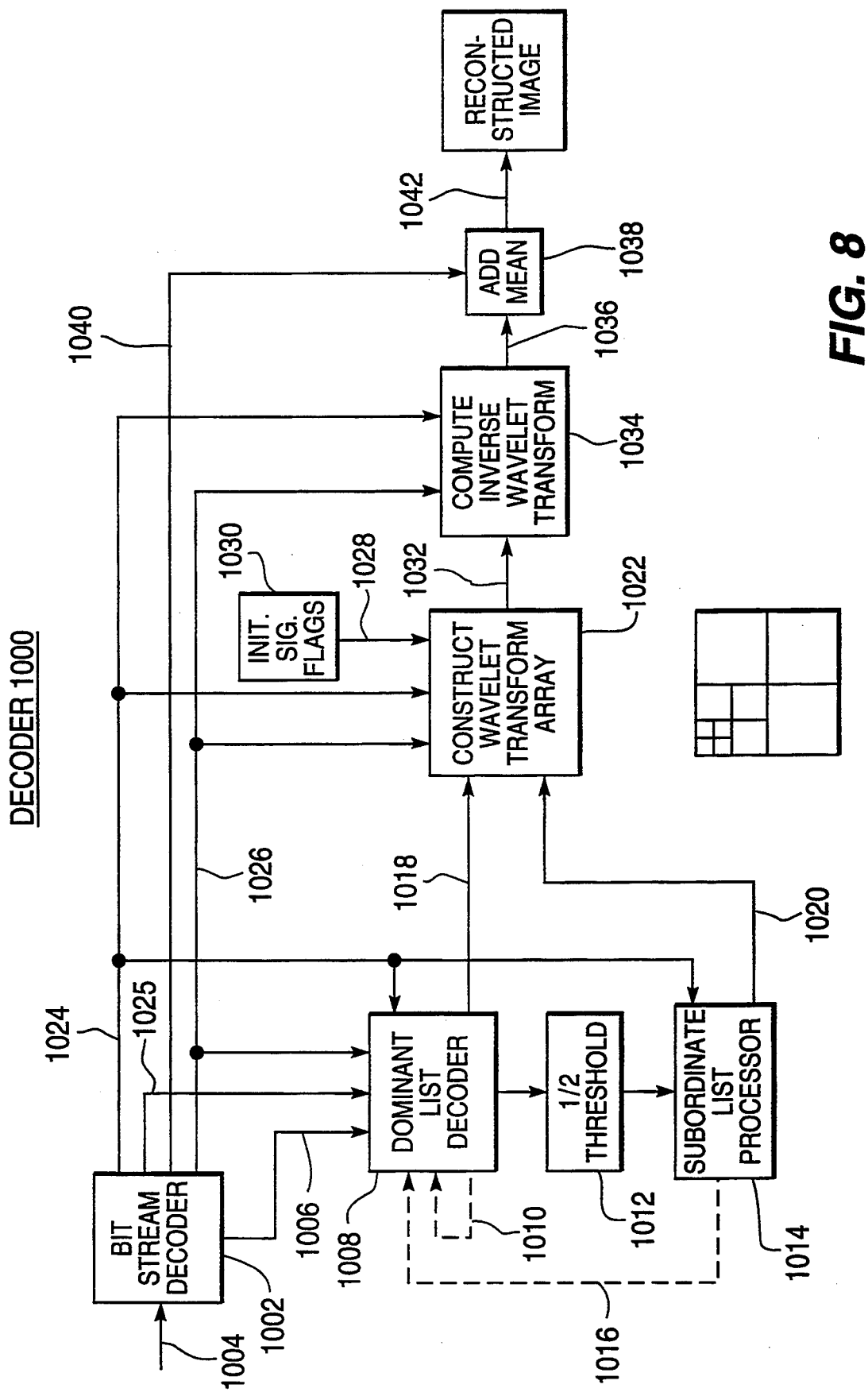
FIG. 8 is a block diagram of the image decoder of the invention.

In FIG. 8 at the start of the decoding process the dominant list includes only the coordinates of the coefficients from the lowest frequency (coarsest) subband, eg LL3 in FIG. 1. The decoder knows the protocol for the order in which the coefficients are scanned on compression, so that it knows the location of all coefficients. The method starts with the step 1102 of fetching the coordinates of the first coefficient on the LL dominant list followed by the step 1104 of checking the identity of the Significance Flag. If the Flag is TRUE, ie the magnitude of the coefficient is greater than an initial threshold $T_0$, then the indices of the three children of the coefficient are appended to the dominant list in step 1106. The system is then cycled through steps 1122 and 1124 to increment the index on the dominant list, compare indices to determine whether the initial LL dominant list has been fully scanned. In the first Dominant List pass, all Significance Flags have the initial value FALSE. However, once a Significance Flag is set to be TRUE, it will remain TRUE for the entire decoding process on all future Dominant List passes.

Step 1102 fetches the next coefficient in the scan. If the Significance Flag is not TRUE, i.e., the magnitude of the coefficient is less than 2T, then a symbol from the arithmetic decoder is decoded in step 1108. In step 1110 a comparison is made to determine if the end of the bit stream has been reached. If YES, the decoding process is complete. If NO, then steps 1112 and 1114 in sequence determine whether the sign bit is POSITIVE or NEGATIVE. Step 1116 then equates the coefficient to either $+3T/2$ or $-3T/2$ depending upon whether the sign bit is POSITIVE or NEGATIVE. The model is then updated for a POSITIVE or NEGATIVE symbol. The position of the coefficient is then appended to the Subordinate List in step 1118 and the Significance Flag for this coefficient is then set to TRUE in step 1120. The indices of the three children of the coefficient are each appended to the corresponding dominant list in step 1106, as was done at the encoder in step 738. The system is then cycled through steps 1122 and 1124 to increment the index on the dominant list, compare indices to determine whether the initial LL dominant list has been fully scanned and start the loop anew.

If the symbol is neither POSITIVE or NEGATIVE, then the symbol is tested in step 1126 to determine if it is the symbol for a ZEROTREE ROOT. If YES, then the model is updated for the ZEROTREE ROOT symbol in step 1128 and the system recycled. If NO, then the model is updated for the ISOLATED ZERO symbol in Step 1128. The indices of the three children of the coefficient are each appended to the corresponding dominant list in step 1106, and the system recycles.

This procedure is repeated for each coefficient on the LL Dominant List until all coefficient are coded and the end of the LL Dominant List is detected in step 1124. At that point the three lists of children of the LL Dominant List coefficient are then concatenated to form a single list appended to the Dominant List in step 1132 and the coding process continued as indicated by step 1134 and as illustrated in FIG. 10.

In FIG. 10 at the start of the decoding process the dominant list includes the coordinates of the coefficients from the child Dominant List produced during the decoding process described with reference to FIG. 9. The method starts with the step 1202 of fetching the coordinates of the first coefficient on the child Dominant List followed by the step 1204 of checking the identity of the Significance Flag. If the flag is TRUE, i.e., the magnitude of the coefficient is greater than 2T and was decoded as significant on a previous dominant pass, then the indices of the four children of the coefficient are each appended to the corresponding dominant list in step 1106, as was done at the encoder in step 738. The system is then cycled through steps 1222 and 1224 to increment the index on the dominant list, compare indices to determine whether the initial LL dominant list has been fully scanned.

Step 1202 then fetches the next coefficient to start the next scan. If the flag is not TRUE, i.e. the magnitude of the coefficient is less than 2T, then a symbol from the arithmetic decoder is decoded in step 1208. In step 1210 a comparison is made to determine if the end of the bit stream has been reached. If YES, the decoding process is complete. If NO, then steps 1212 and 1214 in sequence determine whether the sign bit is POSITIVE or NEGATIVE. Step 1216 then equates the coefficient to either +3T/2 or −3T/2 depending upon whether the sign bit is POSITIVE or NEGATIVE. The model is then updated for a POSITIVE or NEGATIVE symbol. The position of the coefficient is then appended to the Subordinate List in step 1218 and the Significance Flag for this coefficient is then set to TRUE in step 1220. The indices of the children of the coefficient are appended to the dominant list in step 1206. The system is then cycled through steps 1222 and 1224 to increment the index on the dominant list, compare indices to determine whether the Dominant List has been fully scanned and start the loop anew.

If the symbol is neither POSITIVE or NEGATIVE, then the symbol is tested in step 1226 to determine if it is the symbol for a ZEROTREE ROOT. If YES, then the model is updated for the ZEROTREE ROOT symbol in step 1228 and the system recycled. If NO, then the model is updated for the ISOLATED ZERO symbol in step 1230. The indices of the children of the coefficient are appended to the dominant list in step 1206 and the system recycles.

This procedure is repeated for each coefficient on the child Dominant List and all that are appended during the cycling of this process until all coefficients are decoded and the end of the Dominant List is detected in step 1224. At that point all the coefficients have been decoded for that threshold level T. The process continues as indicated by step 1232 in which the threshold is cut in half and the system exits to the Subordinate List in step 1234, as illustrated in FIG. 11, to increase the precision of the coefficients which have thus far been found to be significant. Once the scan Subordinate List is completed at that threshold, the system returns to the LL Dominant List and repeats the process illustrated in FIGS. 9 and 10 at the new threshold T/2 until the end of the list is reached at the lowest threshold used.

In FIG. 11, the refinement of the value of the coefficients placed on the Subordinate List have thus been found to be significant is carried out at a threshold level of T/2. The first step 1302 is clearing the Bottom List, to be defined later. In step 1304 a reference value S is set equal to Y, the magnitude of the wavelet coefficient at the coordinates for the first element on the Subordinate List. In step 1306 the coordinates of the next coefficient on the Subordinate List are fetched. In step 1308, the magnitude Y for the coefficient is obtained from the Subordinate List. In step 1310, the value Y is compared to S. If equal, then the symbol from the arithmetic coder is decoded.

In step 1312, the bit stream is then checked to determine if the end of the stream has been reached. If NO, the symbol is checked in step 1316 to determine if the symbol is a "1". If YES, then the model is updated for the "1" symbol in step 1320 and T/2 is added to the magnitude of the current coefficient in the output wavelet transform array in step 1322. If NO, then the model is updated for the "0" symbol in step 1326, the coefficient is moved to the Bottom List in step 1328 and T/2 is subtracted from the magnitude of the current coefficient in the output wavelet transform array in step 1330.

After step 1322 or 1330, the system then cycles through steps 1332 and 1334 to increment the index on the dominant list and determine whether the end of the Subordinate List has been been reached, respectively. If NO, then the coordinates of the next coefficient are fetched in step 1306 and the loop started anew. If YES, the entire Bottom List is appended to the Subordinate List. Step 1338 the returns the system to decoder 1008 of FIG. 8 and corresponding step 1102 of FIG. 9 to start a new scan of the LL Dominant List at threshold T.

An efficient means for generating a map to identify ZEROTREE ROOTS in the context of successive-approximation, zerotree coding of wavelet coefficients is used in the method of the invention. For each wavelet coefficient having descendants, a bitmask is generated which indicates whether there are any significant descendents corresponding to each power of two value of the threshold. The collection of bitmasks is called a zerotree map. Preferably, all operations using the zerotree map use only simple bitwise operations (LEFT SHIFT, RIGHT SHIFT, OR, AND).

The zerotree map is used in conjunction with successive-approximation coding and zerotree coding of wavelet coefficients as follows:

1) All thresholds are powers of 2, i.e., 1,2,4,8,16,32,64,128, etc.

2) Once a coefficient is found to be significant, for the purpose of determining whether an ancestor is a ZEROTREE ROOT on later dominant passes at smaller threshold, its value shall be considered zero.

An element on a zerotree map has a "1" in the bit position corresponding to the current threshold if it has a descendant that will first be determined to be significant at the current threshold and thus cannot be a ZEROTREE ROOT, or is first determined to be significant at the current threshold. An element on a zerotree map has a "0" in the bit position otherwise.

For each wavelet coefficient that has descendants, there is a corresponding zerotree map element. In the course of encoding dominant passes, when a coefficient on the dominant list is found to be insignificant, and not the descendant of a ZEROTREE ROOT at the current threshold, the zerotree map value and the current threshold are bitwise ANDed, which effectively polls the bit position in the zerotree map corresponding to the current threshold. If the result of the bitwise AND operation is non-zero, an ISOLATED ZERO symbol is encoded indicating the presence of at least one descendant that will first be found significant during the current dominant pass. If the result of the bitwise AND operation is zero, then a ZEROTREE ROOT symbol is encoded indicating that no additional symbols are required for any descendants at the current threshold.

The zerotree map is generated prior to any encoding as illustrated by means 104 for computing the zerotree map 106 in FIG. 3. In the generation of the zerotree map, there is one element corresponding to each wavelet coefficient, including those with no descendants. Once the entire zerotree map is generated, the memory used to hold the zerotree map values for the coefficients with no descendants can be de-allocated.

The following operations are performed independently for each element individually:

1. The magnitude of each wavelet coefficient in the wavelet transform (subband decomposition) is copied into the array for the zerotree map.

2. All bits in the zerotree map's copy except the most significant "1" bit for each wavelet coefficient are set to zero. This causes each zerotree map value to be the largest power-of-two smaller than the magnitude of the corresponding coefficient. This value is referred to as the initial zerotree map value. It can be computed by Right Shifting (shifting all bits to the right in a binary representation of the value) until the value is 1 and then Left Shifting back to the correct position, where new bits added during the shifts are always "0".

The actual zerotree map value Z is defined as the bitwise OR operation between the initial zerotree map value of itself and the initial zerotree map value of all of its descendants. To determine this efficiently, the actual zerotree map value for a child is always determined before that of its parent. The actual zerotree map value of the parent is set equal to the bitwise OR of the initial zerotree map value of the parent and the actual zerotree map value of its children, which would have already been determined. Thus, this computation begins in the highest frequency subband whose coefficients have children, i.e. LH2, HL2, and HH2 in FIG. 1, and continues to lower frequency subbands until the entire zerotree map is complete. Thus, using the bitwise OR operation, a bit position in Z is "1" when either its corresponding coefficient or any of its descendants has their most significant "1" bit at that position.

It is to be understood that the apparatus and method of operation for encoding and decoding information taught herein are illustrative of the invention. Modifications may readily be devised by those skilled in the art without departing from the spirit or scope of the invention. While the various embodiments have been described in terms of two dimensional images, it is to be understood that other types of information and other types of data compression schemes may be used.

I claim:

1. In a digital compression encoder responsive to an array of a relatively large number of multibit coefficients defining image data at a relatively high resolution that has been hierarchical subband decomposed by a wavelet transform at a given plurality of lower resolutions, whereby the lowest low (LL) subband comprises an array having the smallest number of multibit coefficients of all the wavelet-transform subband arrays, each LL subband multibit coefficient comprises an ancestor of all multibit coefficients of all higher subbands descended from that LL subband multibit coefficient, and each of said multibit coefficients of said LL subband and said multibit coefficients of said descendents thereof includes a most significant bit; wherein said encoder includes coding means for deriving a data-compressed code comprising (a) a ZEROTREE symbol at first given coordinates of of said LL subband or at coordinates of descendents of said first given coordinates of said LL subband which are occupied by coefficients that are zerotree roots, (b) an ISOLATED ZERO symbol at second given coordinates of said LL subband or at coordinates of descendents of said second given coordinates of said LL subband which are occupied by isolated-zero coefficients, and (c) at least one type of non-zero symbol at third given coordinates of said LL subband or at coordinates of descendents of said third given coordinates of said LL subband which are occupied by non-zero coefficients; the improvement for efficiently deriving said data-compressed code wherein said encoder comprises:

means responsive to each multibit coefficient of said LL subband and said multibit coefficients of all of its descendents of said wavelet transform for deriving a zerotree map, wherein said zerotree map includes a zerotree-map multibit coefficient corresponding to each coefficient of said LL subband array, and each zerotree-map coefficient has a binary "1" value in a bit position thereof only if either its corresponding LL-subband-array coefficient or any of the descendents of its corresponding LL-subband-array coefficient has its most significant bit in that bit position; and said coding means includes means that starts with a list of coordinates of said relatively small number of coefficients of said LL subband of said array and a relatively high initial threshold value for dynamically deriving in sequence said data-compressed code from the multibit coefficients of the wavelet-transform subband and the multibit coefficients of the zerotree map first at said relatively high initial threshold value and then at one or more successively lower threshold values by ignoring from consideration in said sequential dynamic derivation all coordinates of coefficients which are descendents of coordinates which have already been found in said sequential dynamic derivation to be occupied by coefficients that are zerotree roots.

2. The encoder defined in claim 1, wherein:

at least certain ordinally-arrranged bits of each multibit coefficient of said LL subband and each multibit coefficient of its descendents defines the magnitude of that coefficient, a first of said ordinally-arrranged bits corresponds to the magnitude of said most significant bit, and each other of of said ordinally-arrranged bits corresponds to one-half the magnitude of its immediately preceding bit;

said initial threshold value is equal to one-half the largest zerotree-map value as represented by the most significant bit of all the bits of all the zerotree-map multibit coefficients; and each of said successively lower threshold values is equal to one-half of its immediately preceding threshold value.

3. The encoder defined in claim 1, wherein said coding means comprises:

first cyclically-operated logic means successively responsive to each of dominant lists of coordinates of multibit coefficients and each of said threshold values for deriving a subordinate list of coordinates of multibit coefficients during each cycle of operation thereof, wherein a dominant list is defined as a list that contains the coordinates of those multibit coefficients which (1) have not yet been found to be significant and a symbol is to be generated during that cycle of operation or (2) if a coefficient has been previously found to be significant, one of its descendants has not yet been found to be significant and a symbol is to be generated during that cycle of operation, and wherein a subordinate list is defined as a list that contains the coordinates of those multibit coefficients which have been previously found to be significant with respect to previous, larger, thresholds;

second cyclically-operated logic means successively responsive to each of subordinate lists of coordinates of multibit coefficients derived by said first cyclically-operated logic means and a current one of of said threshold values for deriving a dominant list of coordinates of multibit coefficients during each cycle of operation thereof, which derived dominant list is for use during a subsequent cycle of operation of said first cyclically-operated logic means;

arithmetic coding means for continuously generating a more accurate model of said data-compressed code in response to data supplied thereto which is derived during each cycle of operation of said first logic means and in response to data supplied thereto which is derived during each cycle of operation of said second logic means; and said list of coordinates of said relatively small number of coefficients of said LL subband of said array comprises a starting dominant list of coordinates of multibit coefficients and said relatively high initial threshold value comprises the threshold value which are used during the first cycle of operation of said first logic means.

4. The encoder defined in claim 3, wherein each wavelet transform multibit coefficient includes a significance flag bit that is initially set to signify FALSE, and said first logic means comprises:

means for comparing, in turn, the absolute magnitude $|x|$ of each individual coefficient addressed by said dominant list of coordinates during the current cycle of operation of said first logic means with said threshold value T during that current cycle of operation of said first logic means to (1), if $|x| > T$, append the magnitude X of that coefficient to a subordinate list and then set the magnitude of that coefficient itself to zero and the significance flag bit to TRUE, (2), if $|x| \leq T$ and the significance flag bit is FALSE, employing the corresponding zerotree-map value to define data indicative of whether that coefficient is an ISOLATED ZERO or a ZEROTREE ROOT, whereby that data may be used by said arithmetic coding means to (3) generate an ISOLATED ZERO symbol code in response to said first logic means determining a coefficient to be an ISOLATED ZERO and generate a ZEROTREE ROOT symbol code in response to said first logic means determining a coefficient to be a ZEROTREE ROOT, and (4) using the ISOLATED ZERO symbol code to update said model for an ISOLATED ZERO and using the ZEROTREE ROOT symbol code to update said model for a ZEROTREE ROOT;

index appending means operative, unless said first logic means has determined that coefficient to be a ZEROTREE ROOT, following the comparison by said first logic means during the first cycle operation thereof of each individual coefficient for appending the index of each of the three children of that coefficient of the starting dominant list to a separate one of three corresponding new dominant lists, and following the comparison by said first logic means during the each subsequent cycle operation thereof of each individual coefficient for appending the index of the children of that coefficient of the current dominant list to a new dominant list for use during the next cycle of operation of said first logic means; and means effective after all the individual coefficients addressed by the starting dominant list of coordinates have been operated on during the first cycle of operation of said first logic means for concatenating the three corresponding new dominant lists into a single dominant list for use during the second cycle of operation of said first logic means, and effective after all the individual coefficients addressed by the current dominant list of coordinates have been operated on during each subsequent cycle of operation of said first logic means for cutting the threshold value to the next lower one of said successively lower threshold values and initiating a cycle of operation of said second logic means.

5. The encoder defined in claim 4, wherein each of said multibit coefficients of said array defining said image data includes a sign bit due to the fact that the image mean of the magnitudes of all the pixels defining the image has been subtracted from the magnitude of each individual one of these pixels, wherein said encoder and each of these multibit coefficients, and wherein:

said first logic means further comprises means effective in response to $|x| > T$, to define data indicative of the state of said sign bit which may be used by said arithmetic coding means to generate either a POSITIVE symbol code or a NEGATIVE symbol code in accordance with the state of said sign bit and to update said model accordingly; and said coding means further comprises means for encoding a bit stream header associated with said arithmetic coding means, which bit stream header includes an individual multibit coefficient which defines said image mean.

6. The encoder defined in claim 5, wherein:

said bit stream header also includes individual multibit coefficients which respectively define the number of wavelet scales, the initial threshold value and the dimensions of said image.

7. The encoder defined in claim 3, wherein said second logic means comprises:

means for establishing a bottom list of coordinates of multibit coefficients which is initially cleared; and initial means for determining the magnitude W by which a first coefficient on the subordinate list exceeds the current threshold value.

8. The encoder defined in claim 3, wherein said second logic means further comprises:

first means for determining if the magnitude y by which each individual coefficient, in turn, addressed by said subordinate list of coordinates exceeds the current threshold value is equal to W, and, if not, (1) inserting the entire bottom list at the coordinate position of the subordinate list immediately before the coordinate position of that coefficient, (2) clearing the bottom list, and (3) setting W equal to y, second means for comparing, in turn, the magnitude X of each individual coefficient addressed by said subordinate list of coordinates during the current cycle of operation of said second logic means with said threshold value T during that current cycle of operation of said second logic means to (1), if X>T, to define data that may be used by said arithmetic coding means to generate a "1" symbol code and to update said model for that "1" symbol code, and (2), if X≦T, to define data that may be used by said arithmetic coding means to generate a "0" symbol code, to update said model for that "0" symbol code and move that individual coefficient from the subordinate list to the bottom list; and third means effective after all the individual coefficients addressed by the current subordinate list of coordinates have been operated on during each cycle of operation of said second logic means for appending the entire bottom list to the end of the subordinate list and then initiating the next cycle of operation of said first logic means.

9. The encoder defined in claim 3, wherein said coding means has a given bit budget and further comprises:

means associated with each of said first and second logic means for updating said bit budget on each cycle of operation thereof and for terminating operation thereof if the bit budget is exceeded.

10. In a digital compression decoder for reconstructing image data from a bit stream comprising data bits of arithmetic-coded symbols comprising a ZEROTREE symbol, an ISOLATED ZERO symbol, and at least one type of non-zero symbol that define coefficient models for an array of multibit coefficients of wavelet-transformed hierarchical decomposed subbands of said image data; wherein said decoder has an a priori knowledge of the protocol for the order in which the wavelet-transformed multibit coefficients of said array were scanned on compression so that a list of the coordinates of the multibit coefficients of the lowest low (LL) wavelet-transformed subband of said array are predetermined; wherein (a) a ZEROTREE symbol occurs at first given coordinates of of said LL subband or at coordinates of descendents of said first given coordinates of said LL subband which correspond to coefficients that are zerotree roots, (b) an ISOLATED ZERO symbol occurs at second given coordinates of of said LL subband or at coordinates of descendents of said second given coordinates of said LL subband which correspond to isolated-zero coefficients, and (c) at least one type of non-zero symbol at third given coordinates of said LL subband or at coordinates of descendents of said third given coordinates of said LL subband which correspond to non-zero coefficients; the improvement for efficiently reconstructing said image data wherein said decoder comprises:

data decoding means responsive to said data bits applied thereto for deriving the data values of said wavelet-transformed multibit coefficients from said arithmetic-coded symbols that starts with a list of coordinates of said relatively small number of multibit coefficients of said LL subband of said array and a relatively high initial threshold value for dynamically deriving in sequence the values of said wavelet-transformed multibit coefficients first at said relatively high initial threshold value and then at one or more successively lower threshold values by ignoring from consideration in said sequential dynamic derivation all coordinates of coefficients which are descendents of coordinates which have already been found in said sequential dynamic derivation to be occupied by a ZEROTREE symbol.

11. The decoder defined in claim 10, wherein:

each of said successively lower threshold values is equal to one-half of its immediately preceding threshold value.

12. The decoder defined in claim 10, wherein said data decoding means comprises:

setting means for initially setting the magnitude of each of the values of said wavelet-transformed multibit coefficients of said array to zero;

arithmetic decoding means for decoding said arithmetic-coded symbols;

first cyclically-operated logic means successively responsive to each of dominant lists of coordinates of multibit coefficients, certain decoded symbols, and each of said threshold values for deriving a subordinate list of coordinates of multibit coefficients and updating models of the values of said wavelet-transformed multibit coefficients of said array during each cycle of operation thereof, wherein a dominant list is defined as a list that contains the coordinates occupied by those arithmetic-coded symbols that define multibit coefficients which (1) have not yet been found to be significant and a symbol is to be decoded during that cycle of operation or (2) if a coefficient defined by a decoded arithmetic-coded symbol has been previously found to be significant, one of its descendants has not yet been found to be significant and a symbol is to be decoded during that cycle of operation, and wherein a subordinate list is defined as a list that contains the coordinates of those multibit coefficients which have been previously found to be significant with respect to previous, larger, thresholds;

second cyclically-operated logic means successively responsive to each of subordinate lists of coordinates of multibit coefficients derived by said first cyclically-operated logic means, other decoded symbols, and a current one of of said threshold values for deriving a dominant list of coordinates of multibit coefficients and updating models of the values of said wavelet-transformed multibit coefficients of said array during each cycle of operation thereof during each cycle of operation thereof, which derived dominant list is for use during a subsequent cycle of operation of said first cyclically-operated logic means; and said list of coordinates of said relatively small number of coefficients of said LL subband of said array comprises a starting dominant list of coordinates of multibit coefficients and said relatively high initial threshold value comprises the threshold value which are used during the first cycle of operation of said first logic means.

13. The decoder defined in claim 12, wherein each wavelet transform multibit coefficient of said array includes a significance flag bit that is initially set to signify FALSE by said setting means, and wherein said first logic means comprises:

means responsive to the setting of said significance flag bit being FALSE for determining, in turn, for the decoded symbol corresponding to each individual coefficient addressed by said dominant list of coordinates during the current cycle of operation of said first logic means is an ISOLATED ZERO symbol, a ZEROTREE ROOT symbol or is neither; if neither, put a value equal to 3/2 of the threshold value T during that cycle in the corresponding coefficient of an output map, append coordinates of that coefficient to said subordinate list and set significance flag to TRUE; if an ISOLATED ZERO symbol, update model for ISOLATED ZERO symbol; and if a ZEROTREE ROOT symbol, update model for ZEROTREE ROOT symbol;

index appending means operative only if said significance flag is TRUE or the decoded symbol has been determined to be other than a ZEROTREE ROOT symbol for appending the index of each of the three children of that coefficient of the starting dominant list to a separate one of three corresponding new dominant lists, and following the comparison by said first logic means during the each subsequent cycle operation thereof of each individual coefficient for appending the index of the children of that coefficient of the current dominant list to a new dominant list for use during the next cycle of operation of said first logic means; and means effective after all the individual coefficients addressed by the starting dominant list of coordinates have been operated on during the first cycle of operation of said first logic means for concatenating the three corresponding new dominant lists into a single dominant list for use during the second cycle of operation of said first logic means, and effective after all the individual coefficients addressed by the current dominant list of coordinates have been operated on during each subsequent cycle of operation of said first logic means for cutting the threshold value to the next lower one of said successively lower threshold values and initiating a cycle of operation of said second logic means.

14. The decoder defined in claim 13, wherein each wavelet transform multibit coefficient of said array includes a sign bit, and wherein:

said means for determining determines, in order, whether the decoded symbol corresponding to each individual coefficient addressed by said dominant list of coordinates during the current cycle of operation of said first logic means is a POSITIVE symbol, NEGATIVE symbol, ISOLATED ZERO symbol, or a ZEROTREE ROOT symbol, and the value equal to $3T/2$ put in the corresponding coefficient of said output map during that cycle is $+3T/2$ in response to a POSITIVE symbol and $-3T/2$ in response to a NEGATIVE symbol.

15. The decoder defined in claim 14, wherein said second logic means comprises:

means for establishing a bottom list of coordinates of multibit coefficients which is initially cleared; and initial means for setting the initial magnitude $S=y$, where y is the magnitude value of the wavelet coefficient at the coordinates of the first element on the subordinate list.

16. The decoder defined in claim 15, wherein said second logic means further comprises:

first means for determining if the magnitude y of each individual wavelet coefficient, in turn, addressed by said subordinate list of coordinates is equal to S, and, if not, (1) inserting the entire bottom list at the coordinate position of the subordinate list immediately before the coordinate position of that coefficient, (2) clearing the bottom list, and (3) setting S equal to y second means responsive to a decoded symbol from the arithmetic decoder of that individual wavelet coefficient for first determining whether the decoded symbol is that decoded symbol is an "end-of bit-stream" symbol, a "1" symbol, or said decoded symbol is neither, is neither, and in response to (1) an "end-of bit-stream" symbol, terminating operation of said decoder, (2) a "1" symbol,, updating model for a "1" symbol and adding $T/2$ to the magnitude of that coefficient in said output map, and (3) said decoded symbol being neither, updating model for a "0" symbol, moving that coefficient from the subordinate list to the bottom list and subtracting $T/2$ from the magnitude of that coefficient in said output map; and third means effective after all the individual coefficients addressed by the current subordinate list of coordinates have been operated on during each cycle of operation of said second logic means for appending the entire bottom list to the end of the subordinate list and then initiating the next cycle of operation of said first logic means.

17. The decoder defined in claim 10, wherein said bit stream comprises both said data bits and header bits defining image dimensions, said initial threshold value and the number of wavelet scales, and said decoding means further comprises:

means for separating the header bits from said data bits and decoding said header bits to derive separate header multibit coefficients including ones that respectively define said image dimensions, said initial threshold value and the number of wavelet scales; and means for applying said separate multibit coefficients as inputs to said data decoding means.

18. The decoder defined in claim 17, further comprising:

means responsive to said derived the data values of said wavelet-transformed multibit coefficients and said multibit coefficients that define said image dimensions and the number of wavelet scales for computing the coefficients of an inverse wavelet transform of said wavelet-transformed multibit coefficients.

19. The decoder defined in claim 18, wherein said data values of said wavelet-transformed multibit coefficients image data includes a sign bit due to the fact that the image mean of the magnitudes of all the pixels defining the image has been subtracted from the magnitude of each individual one of these pixels and said separate header multibit coefficients include one that defines said image mean, and said decoder further comprises:

means for adding said coefficient that defines said image mean to each of the coefficients of said inverse wavelet transform thereby to reconstruct said image data.

20. A method for deriving a zerotree map for use in digitally compression encoding an array of a relatively large number of multibit coefficients defining image data at a relatively high resolution that has been hierarchical subband decomposed by a wavelet transform at a given plurality of lower resolutions, whereby the lowest low (LL) subband comprises an array having the smallest number of multibit coefficients of all the wavelet-transform subband arrays, each LL subband multibit coefficient comprises an ancestor of all multibit coefficients of all higher subbands descended from that LL subband multibit coefficient, and each of said multibit coefficients of said LL subband and said multibit coefficients of said descendents thereof includes a most significant bit; said method comprising the step of:

generating a separate zerotree-map multibit coefficient corresponding to each coefficient of said LL subband array such that each zerotree-map coefficient has a binary "1" value in a bit position thereof only if either its corresponding LL-subband-array coefficient or any of the descendents of its corresponding LL-subband-array coefficient has its most significant bit in that bit position.

21. A system comprising (1) an encoder for efficiently generating a digital compressed code in response to an array of a relatively large number of multibit coefficients defining image data at a relatively high resolution that has been hierarchical subband decomposed by a wavelet transform at a given plurality of lower resolutions, whereby the lowest low (LL) subband comprises an array having the smallest number of multibit coefficients of all the wavelet-transform subband arrays, each LL subband multibit coefficient comprises an ancestor of all multibit coefficients of all higher subbands descended from that LL subband multibit coefficient, and each of said multibit coefficients of said LL subband and said multibit coefficients of said descendents thereof includes a most significant bit; wherein said encoder includes coding means for deriving said data-compressed code comprising (a) a ZEROTREE symbol at first given coordinates of of said LL subband or at coordinates of descendents of said first given coordinates of said LL subband which are occupied by coefficients that are zerotree roots, (b) an ISOLATED ZERO symbol at second given coordinates of of said LL subband or at coordinates or descendents of said second given coordinates of said LL subband which are occupied by isolated-zero coefficients, and (c) at least one type of non-zero symbol at third given coordinates of of said LL subband or at coordinates of descendents of said third given coordinates of said LL subband which are occupied by non-zero coefficients; and (2) a decoder for efficiently decoding the digital compressed code generated by said encoder; wherein:

said encoder includes (3) means responsive to each multibit coefficient of said LL subband and said multibit coefficients of all of its descendents of said wavelet transform for deriving a zerotree map, wherein said zerotree map includes a zerotree-map multibit coefficient corresponding to each coefficient of said LL subband array, and each zerotree map coefficient has a binary "1" value in a bit position thereof only if either its corresponding LL-subband-array coefficient itself or any of the descendents of its corresponding LL-subband-array coefficient has its most significant bit in that bit position, and (4) said coding means includes means that starts with a list of coordinates of said relatively small number of coefficients of said LL subband of said array and a relatively high initial threshold value for dynamically deriving in sequence said data-compressed code from the multibit coefficients of the wavelet-transform subband and the multibit coefficients of the zerotree map first at said relatively high initial threshold value and then at one or more successively lower threshold values by ignoring from consideration in said sequential dynamic derivation all coordinates of coefficients which are descendents of coordinates which have already been found in said sequential dynamic derivation to be occupied by coefficients that are zerotree roots; and said decoder includes (5) data decoding means responsive to said data bits of said arithmetic-coded symbols of said data-compressed bit stream applied thereto for deriving the data values of said wavelet-transformed multibit coefficients from said arithmetic-coded symbols that starts with a list of a priori known coordinates of said relatively small number of multibit coefficients of said LL subband of said array and a relatively high initial threshold value for dynamically deriving in sequence the values of said wavelet-transformed multibit coefficients first at said relatively high initial threshold value and then at one or more successively lower threshold values by ignoring from consideration in said sequential dynamic derivation all coordinates of coefficients which are descendents of coordinates which have already been found in said sequential dynamic derivation to be occupied by a ZEROTREE symbol.

\* \* \* \* \*